(12) United States Patent  
Neuschaefer-Rube et al.

(10) Patent No.: US 12,025,520 B2  
(45) Date of Patent: Jul. 2, 2024

(54) ARRANGEMENT FOR MEASURING A TORQUE ACTING ON A STEERING SHAFT OF A MOTOR VEHICLE AND METHOD FOR CHECKING THE ARRANGEMENT

(71) Applicant: Schaeffler Technologies AG & Co. KG, Herzogenaurach (DE)

(72) Inventors: Stephan Neuschaefer-Rube, Herzogenaurach (DE); Thomas Lindenmayr, Nuremberg (DE); Bernd Wittmann, Pommersfelden (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 316 days.

(21) Appl. No.: 17/608,181

(22) PCT Filed: Apr. 29, 2020

(86) PCT No.: PCT/DE2020/100351  
§ 371 (c)(1),  
(2) Date: Nov. 2, 2021

(87) PCT Pub. No.: WO2020/224712  
PCT Pub. Date: Nov. 12, 2020

(65) Prior Publication Data  
US 2022/0214239 A1  Jul. 7, 2022

(30) Foreign Application Priority Data  
May 9, 2019  (DE) .................... 10 2019 112 155.8

(51) Int. Cl.  
*G01L 25/00*  (2006.01)  
*G01L 3/10*  (2006.01)  
(Continued)

(52) U.S. Cl.  
CPC ............ *G01L 25/003* (2013.01); *G01L 3/102* (2013.01); *G01M 17/06* (2013.01); *G01R 33/091* (2013.01)

(58) Field of Classification Search  
None  
See application file for complete search history.

(56) References Cited

U.S. PATENT DOCUMENTS 6,758,105 B2  7/2004  Viola et al.  
7,493,831 B2 *  2/2009  Varonis .................. G01L 3/105  
73/862.333

(Continued)

FOREIGN PATENT DOCUMENTS

CN  107683404 A  2/2018  
CN  108444628 A  8/2018  
(Continued)

*Primary Examiner* — Peter J Macchiarolo  
*Assistant Examiner* — Jermaine L Jenkins

(57) ABSTRACT

A method test an arrangement for measuring a torque acting on a steering shaft of a motor vehicle. The measurement is carried out using the inverse magnetostrictive effect. The steering shaft has an axis and at least two magnetization areas extending circumferentially around the axis. The arrangement comprises at least four magnetic field sensors for measuring an axial component of a magnetic field caused by the magnetization as well as by the torque. There are at least two combinations of at least two of the magnetic field sensors each, each of which is sufficient to measure the torque. First and second measurement values of the torque are determined with first and second combinations of the magnetic field sensors. The first measurement value and the second measurement value are compared, as a result of which a malfunction of the arrangement can be recognized.

20 Claims, 4 Drawing Sheets

(51) Int. Cl.
*G01M 17/06* (2006.01)
*G01R 33/09* (2006.01)

(56) References Cited

U.S. PATENT DOCUMENTS

| | | | |
|---|---|---|---|
| 8,020,454 B2 | 9/2011 | Ishihara et al. | |
| 8,087,304 B2 | 1/2012 | Lee | |
| 8,578,794 B2 | 11/2013 | Lee | |
| 8,584,533 B2 | 11/2013 | Miyoshi et al. | |
| 8,650,969 B2 | 2/2014 | Arimura et al. | |
| 8,672,086 B2 | 3/2014 | Wong et al. | |
| 8,776,619 B2 | 7/2014 | Jammer | |
| 8,893,562 B2 | 11/2014 | Barraco et al. | |
| 8,943,879 B2 | 2/2015 | Kang | |
| 9,114,833 B2 | 8/2015 | Becker et al. | |
| 9,151,686 B2 | 10/2015 | Barraco et al. | |
| 9,296,415 B2 | 3/2016 | Itamoto et al. | |
| 9,587,996 B2 * | 3/2017 | Matysik | G01L 5/0061 |
| 9,630,648 B2 | 4/2017 | Shiraishi et al. | |
| 10,663,363 B2 * | 5/2020 | Lu | G01L 3/102 |
| 11,486,776 B2 * | 11/2022 | Simard | G01L 5/0023 |
| 2004/0154412 A1 | 8/2004 | Moore et al. | |
| 2007/0227269 A1 | 10/2007 | Fukuda et al. | |
| 2014/0360285 A1 | 12/2014 | Barraco et al. | |
| 2022/0034734 A1 * | 2/2022 | Veillette | H10N 35/101 |

FOREIGN PATENT DOCUMENTS

| | | |
|---|---|---|
| DE | 102013219761 B3 | 1/2015 |
| DE | 102015102337 A1 | 8/2016 |
| DE | 102015209286 A1 | 11/2016 |
| DE | 102018107570 A1 | 10/2019 |
| EP | 3364163 A1 | 8/2018 |
| WO | 9956099 A1 | 11/1999 |
| WO | 2006053244 A2 | 5/2006 |
| WO | 2016127987 A1 | 8/2016 |
| WO | 2019185095 A1 | 10/2019 |

* cited by examiner

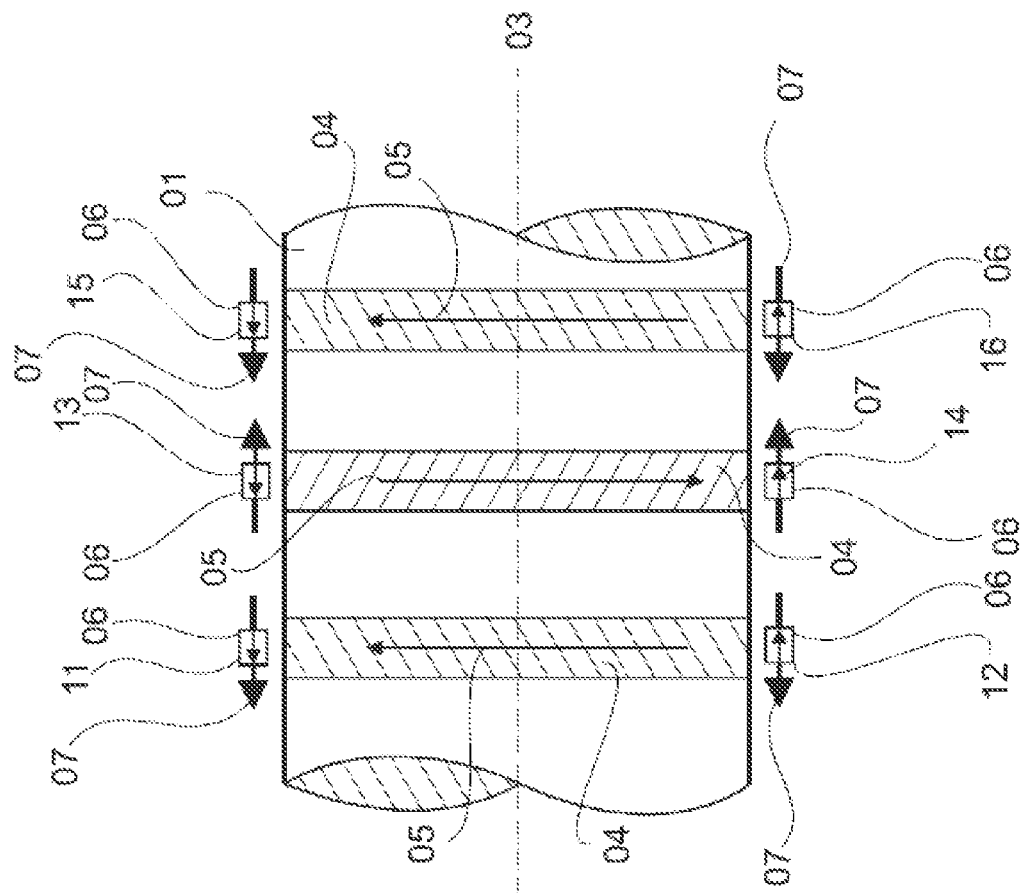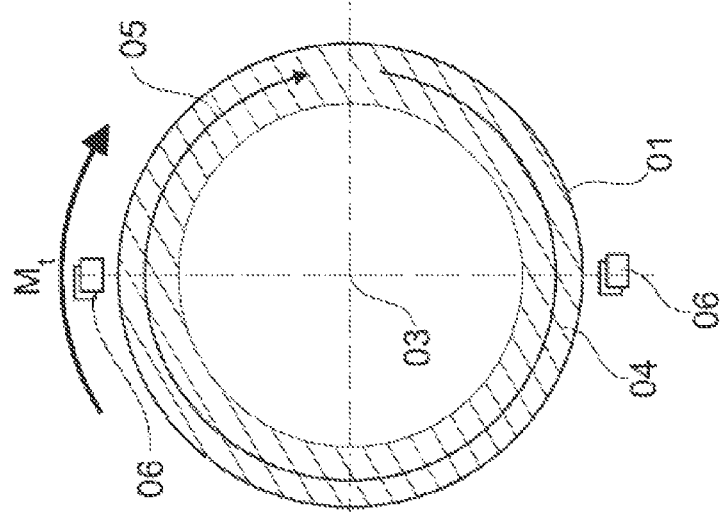
Fig. 3

ARRANGEMENT FOR MEASURING A TORQUE ACTING ON A STEERING SHAFT OF A MOTOR VEHICLE AND METHOD FOR CHECKING THE ARRANGEMENT

CROSS-REFERENCE TO RELATED APPLICATIONS

This application is the U.S. National Phase of PCT Appln. No. PCT/DE2020/100351 filed Apr. 29, 2020, which claims priority to DE 10 2019 112 155.8 filed May 9, 2019, the entire disclosures of which are incorporated by reference herein.

TECHNICAL FIELD

The present disclosure relates first of all to a method for testing an arrangement for measuring a torque acting on a steering shaft of a motor vehicle. The steering shaft has an axis in which it extends and about which it can rotate. The torque is measured using the inverse magnetostrictive effect. The steering shaft has at least two magnetization areas which extend circumferentially around the axis and which form a primary sensor for the measurement. The arrangement comprises at least four magnetic field sensors as secondary sensors. The method allows a malfunction of the arrangement to be identified. The disclosure also relates to an arrangement for measuring a torque acting on a steering shaft of a motor vehicle.

BACKGROUND

U.S. Pat. No. 6,758,105 B2 discloses a magnetoelastic torque sensor arrangement for detecting a torsional load on a shaft; for example, the steering column of a motor vehicle. The torque sensor assembly includes a molded plastic body defining an axial channel and having an axial opening. The torque sensor arrangement also comprises a U-shaped lead frame which is embedded in the molded plastic body and has side sections which extend around the channel within the side sections of the molded plastic body. Magnetic flow sensors are embedded in the side parts of the molded plastic body and connected to the lead frame. The shaft is received radially through the axial opening in the molded plastic body and positioned coaxially within the channel for use. The magnetic flux sensors are positioned in a predetermined and fixed arrangement around the shaft. The sensor array preferably comprises sensors that are arranged in a plane comprising the axis; either diametrically opposite or axially spaced.

U.S. Pat. No. 8,672,086 B2 discloses a steering device which comprises a rotatable steering shaft with an outer side, an input end for connecting a steering element and an output end for connecting to at least one steerable wheel of a vehicle. An electric motor is used to drive the steering shaft. The steering shaft is magnetized and also serves as a torque sensor. At least one magnetic field sensor is located adjacent to the outside of the steering shaft. The steering shaft and the at least one magnetic field sensor form a torque sensor for detecting a torque applied to the steering shaft by the manually operable steering element.

U.S. Pat. No. 8,650,969 B2, U.S. Pat. No. 9,630,648 B2 and U.S. Pat. No. 8,584,533 B2 show magnetostrictive torque sensors which are based on the fact that the permeability of the material of a shaft or the like changes as a result of torsion.

U.S. Pat. No. 8,020,454 B2 and U.S. Pat. No. 9,114,833 B2 show torque sensors, inter alia for a steering shaft of a motor vehicle, which comprise a magnetic pole ring with alternating magnetic poles.

U.S. Pat. No. 8,943,879 B2 and U.S. Pat. No. 8,776,619 B2 show torque sensors, inter alia for a steering shaft of a motor vehicle that use magnetic tooth structures.

From U.S. Pat. No. 9,296,415 B2 an electronically operated motor vehicle steering column is known which comprises a torque sensor for the steering shaft.

U.S. Pat. No. 8,893,562 B2 discloses a method for detecting magnetic noise in a magnetoelastic torque sensor. The torque sensor comprises a torque converter with oppositely polarized magnetizations and several magnetic field sensors that can be switched between.

U.S. Pat. No. 8,578,794 B2 discloses a magnetoelastic torque sensor with a longitudinally extending element and with several magnetoelastically active regions and with primary and secondary magnetic field sensors which are axially spaced apart.

A magnetoelastic torque sensor is known from U.S. Pat. No. 8,087,304 B2 which comprises a longitudinally extending element with a plurality of magnetoelastically active regions. The torque sensor comprises primary and secondary magnetic field sensors that are connected as a Wheatstone bridge.

US Pat. No. 2004/0154412 A1 discloses a sensor for measuring diverging magnetic fields which emerge from a magnetoelastic wave. The shaft has two magnetization areas, each of which is assigned two coils for measuring the magnetic fields.

US Pat. No. 2014/0360285 A1 discloses a magnetoelastic torque sensor with which a torque acting on a hollow shaft can be measured. The hollow shaft has three circumferentially magnetized magnetization areas with alternating polarities. Four secondary magnetic field sensors are arranged opposite the magnetization areas.

A magnetoelastic torque sensor, which is said to have reduced signal noise, is known from U.S. Pat. No. 9,151,686 B2. The torque sensor comprises a hollow shaft with three circumferentially magnetized magnetization areas with alternating polarities. Up to eight magnetic field sensors are arranged opposite the magnetization areas.

DE10 2015 209 286 A1 discloses an arrangement and a method for measuring a force and/or a torque on a machine element using the inverse magnetostrictive effect. The machine element has at least one magnetization area for magnetization. At least two spaced apart magnetic field sensors are used to measure a magnetic field caused by the magnetization as well as by the force and/or torque. According to the method, the measurement signals from the magnetic field sensors are processed individually.

SUMMARY

It is desirable to improve the detection of malfunctions when measuring a torque acting on a steering shaft of a motor vehicle based on the inverse magnetostrictive effect, in order, for example, to be able to meet higher requirements in the area of functional safety.

The method is used to test an arrangement that is designed to measure a torque acting on a steering shaft of a motor vehicle. The steering shaft is also referred to as a steering column and forms a part of the steering system of the motor vehicle. The steering shaft is used to transmit a torque from the steering wheel and possibly also to the steering wheel. The steering shaft has an axis in which it extends. This axis also forms an axis of rotation of the steering shaft. With the method, correct functioning of the arrangement is monitored and a malfunction of the arrangement can be recognized.

The torque acts on the steering shaft of the arrangement, as a result of which mechanical stresses occur and the steering shaft is usually slightly deformed. The directions given below, namely the axial direction, the radial direction and the tangential or circumferential direction, refer to the mentioned axis of the steering shaft.

The arrangement is preferably designed for measuring a torque which lies within the axis, so that it is a torsional torque by which the steering shaft is loaded. The vector of the torque lies within the axis. The torque is preferably a steering torque. The arrangement is preferably used to measure the steering torque. The arrangement preferably forms a component of an electromechanical power steering system. The electromechanical power steering system also includes an electromechanical drive unit and an electronic control unit, which is electrically connected to the arrangement used for measuring the steering torque. The electromechanical drive unit of the electromechanical power steering system is controlled based on a measured value of the steering torque measured using the arrangement.

The steering shaft has at least two magnetization areas extending circumferentially around the axis, each for a magnetization formed in the steering shaft. Thus, there are at least two magnetization areas surrounding the axis, i.e., circular magnetization areas, whereby the axis itself preferably does not form part of the magnetization areas. The magnetization areas preferably only have a tangential alignment with respect to a surface of the steering shaft that extends around the axis. The magnetization areas preferably each extend along a closed path around the axis and the magnetization areas may exhibit short gaps. The magnetization areas preferably have the same spatial extent and are axially spaced. The magnetization areas are particularly preferably designed in the form of magnetization tracks. The magnetization areas form a primary sensor for determining the torque.

The steering shaft preferably also has magnetically neutral areas which are each arranged axially between the magnetization areas and/or axially next to the magnetization areas of the steering shaft. The steering shaft preferably has at least one of the mentioned magnetically neutral areas. The magnetically neutral areas neither exhibit permanent magnetization, nor is the arrangement designed to temporarily magnetize the magnetically neutral areas. The magnetically neutral areas are preferably not magnetized. The magnetically neutral areas are preferably each formed in an axial section of the steering shaft.

The arrangement also includes at least four magnetic field sensors, which form a secondary sensor for determining the torque. The primary sensors, i.e., the magnetization areas, are used to convert the torque to be measured into a corresponding magnetic field, while the secondary sensors enable this magnetic field to be converted into electrical signals. The magnetic field sensors are each designed for the individual measurement of an axially aligned directional component of a magnetic field caused by the magnetization and the torque. The magnetic field mentioned occurs due to the inverse magnetostrictive effect. Thus, the measurement made possible with the arrangement is based on the inverse magnetostrictive effect.

There are at least two different combinations of at least two of the magnetic field sensors, each of these combinations being sufficient for measuring the torque. The at least two combinations are therefore redundant in terms of their suitability for measuring the same torque. The combinations are to be understood in the sense of combinatorics and each represent a selection of at least two of the magnetic field sensors, wherein the combinations may comprise different numbers of the magnetic field sensors and one of the combinations may be formed by all of the magnetic field sensors. At least two different combinations can be selected from the at least four magnetic field sensors, each of which is suitable for measuring the torque. Particularly preferably, there are at least three of the combinations of at least two of the magnetic field sensors, each of these combinations being sufficient for measuring the torque.

The magnetic field sensors are arranged opposite the steering shaft, with there being preferably only a small radial distance between the magnetic field sensors and an outer or inner surface of the steering shaft. The magnetic field sensors are preferably located at the same distance from the axis.

The magnetization areas and the magnetic field sensors arranged opposite the magnetization areas can be arranged at a largely arbitrary axial position of the steering shaft; for example, in an axial section of the steering shaft, which is connected to a steering wheel, to a steering gear or to an electromechanical drive unit of an electromechanical power steering system, or between two axial ends of the steering shaft. If the steering shaft has a universal joint, the magnetization areas and the magnetic field sensors arranged opposite the magnetization areas can also be arranged in an axial section of the steering shaft connected to the universal joint.

In a step of the method, a first measurement value of the torque is determined with a first of the combinations of the magnetic field sensors while the torque is acting. The first measurement value is determined from measurement signals from the individual magnetic field sensors belonging to the first combination.

In a further step of the method, a second measurement value of the torque is determined with a second of the combinations of the magnetic field sensors while the torque is acting. The second measurement value is determined from measurement signals from the individual magnetic field sensors belonging to the second combination.

The determination of the first measurement value and the determination of the second measurement value preferably take place simultaneously or at least within a time span in which the torque does not change. The measurement values represent qualitatively and quantitatively the same torque.

Since the first combination of the magnetic field sensors and the second combination of the magnetic field sensors are each sufficient to measure the torque, the first measurement value and the second measurement value are the same if the arrangement is working properly. The first measurement value is compared with the second measurement value, so that the result of this comparison can be used to conclude that the arrangement is functioning correctly or that it is functioning incorrectly. If the comparison leads to the conclusion that the system is functioning incorrectly, it is also preferably determined which of the individual magnetic field sensors is functioning incorrectly.

A particular advantage of the method is that the result of the comparison of the measurement values provides a largely reliable statement as to whether the arrangement is working correctly or incorrectly.

The at least two magnetization areas can be magnetized permanently or temporarily. The magnetization areas are preferably permanently magnetized, so that the magnetization is formed by permanent magnetization. Alternatively, the arrangement also preferably has at least one magnet for magnetizing the magnetization areas, so that the magnetization of the magnetization areas is basically temporary. The at least one magnet can be made up of a permanent magnet or preferably an electromagnet.

The permanently or temporarily magnetized magnetization areas are preferably magnetically neutral to the outside of the magnetization areas when the steering shaft is not loaded by a torque, so that no technically relevant magnetic field can be measured outside the magnetization areas.

The magnetization areas each represent a part of the volume of the steering shaft. The magnetization areas are preferably each designed in a ring shape, the axis of the steering shaft also forming a central axis of the respective ring shape. Particularly preferably, the magnetization areas each have the shape of a hollow cylinder coaxial with the axis of the steering shaft.

The magnetization areas preferably each exhibit a high degree of magnetostriction.

The magnetization areas are preferably arranged axially spaced from one another, with it being possible for one of the magnetically neutral areas to be arranged between two adjacent magnetization areas. If more than two of the magnetization areas are present, they are preferably each at the same distance from one another.

Axially adjacent magnetization areas extending circumferentially around the axis preferably have opposite polarities, i.e., they have opposite directions of rotation.

The steering shaft consists of a magnetostrictive or magnetoelastic material, at least in the magnetization area. The steering shaft preferably consists entirely of the magnetostrictive or magnetoelastic material. The steering shaft is preferably made of steel.

The steering shaft preferably has the shape of a cylinder or possibly a prism, the cylinder or the prism being arranged coaxially to the axis. The cylinder or the prism is preferably straight. The steering shaft preferably has the shape of a straight circular cylinder, the circular cylinder being arranged coaxially to the axis. In particular embodiments, the cylinder or prism is conical in shape. The steering shaft can also be designed as a hollow shaft so that it has a cavity.

The magnetic field sensors are preferably each made up of a semiconductor sensor. The at least two magnetic field sensors are alternatively preferably each made up of an MR sensor, a Hall sensor, a field plate, a SQUID, a coil element, a Foerster probe or a fluxgate magnetometer. In principle, other types of sensors can also be used, provided they are suitable for measuring the axial directional component of the magnetic field caused by the inverse magnetostrictive effect.

The magnetic field sensors are preferably at the same distance from the axis of the steering shaft. In principle, the magnetic field sensors can be arranged outside the steering shaft or inside a cavity in the steering shaft; for example, if the steering shaft is designed as a hollow shaft.

The magnetic field sensors preferably each have an axial position like one of the magnetization areas. The magnetic field sensors preferably each have an axial position that is equal to a mean axial position of one of the magnetization areas.

The magnetic field sensors preferably each have the same tangential or the same circumferential position as at least one other of the magnetic field sensors. These at least two magnetic field sensors are preferably located together on a straight line parallel to the axis. These at least two magnetic field sensors, which have the same tangential or the same circumferential position, are axially adjacent and preferably each have the same axial position as axially adjacent ones of the magnetization areas. It is also possible for two magnetic field sensors having the same tangential or the same circumferential position to have the same axial position as only one of the magnetization areas.

At least one of the magnetization areas preferably has the same axial position as at least two of the magnetic field sensors, so that two of the magnetic field sensors are assigned to this magnetization area. These two magnetic field sensors having the same axial position are preferably arranged opposite one another with respect to the axis so that they exhibit a central angle of 180° to one another and a straight line intersecting the two magnetic field sensors intersects the axis perpendicularly. Further preferably, each of the magnetization areas has the same axial position as two of the magnetic field sensors, so that at least two of the magnetic field sensors are assigned to each of the magnetization areas.

The arrangement preferably further comprises a measurement signal processing unit which is designed to determine and compare the measurement values. The magnetic field sensors are preferably individually electrically connected to the measurement signal processing unit, so that in each case a single measurement signal is passed from each of the magnetic field sensors to the measurement signal processing unit. Preferred embodiments of the method include a step in which the magnetic field sensors are individually calibrated. As a result, an offset can be compensated and the sensitivity of the magnetic field sensors can be compared with one another, so that the reliability of the error detection is increased yet again.

At least three of the measurement values are particularly preferably determined and compared with one another. Accordingly, there are preferably at least three of the combinations of at least two of the magnetic field sensors, each of these combinations being sufficient for measuring the torque. A third measurement value of the torque is determined with a third of the combinations of the magnetic field sensors while the torque is acting. The first measurement value, the second measurement value and the third measurement value are compared with one another. At least four of the measurement values are furthermore preferably determined and compared with one another. Those embodiments in which three or more of the measurement values are determined and compared preferably include an additional step by which, in the event of discrepancies between the measurement values, the one or ones of the magnetic field sensors that are not operating correctly are determined. In addition, it can be determined if one of the magnetization areas is functioning incorrectly.

In preferred embodiments of the method, absolute amounts of the differences between the measurement values or squares of the differences between the measurement values are formed in order to compare the measurement values. A sum of the absolute amounts of the differences between the measurement values or a sum of the squares of the differences between the measurement values is preferably formed. The corresponding sum is preferably used as a test signal.

An error signal is preferably output if the sum of the absolute amounts of the differences between the measurement values or the sum of the squares of the differences between the measurement values exceeds a previously defined maximum. The maximum value defines in advance the difference between the measurement values up to which the arrangement is considered to operate without error. The error signal is preferably reported to a higher-level controller or to an operator of the arrangement, so that the higher-level controller or the operator becomes aware that the arrangement is no longer measuring without error.

In a first particularly preferred embodiment of the method, the arrangement is designed to measure a torque, i.e., a torsional torque, acting on the steering shaft and located within the axis. The steering shaft exhibits two of the magnetization areas with opposite polarities. Each of the magnetization areas has the same axial position as two of the magnetic field sensors, these two magnetic field sensors having the same axial position being arranged opposite one another with respect to the axis. Two of the four magnetic field sensors each have the same tangential position and are axially adjacent. A first of the four magnetic field sensors outputs a measurement signal $a_1$. The magnetic field sensor opposite the first magnetic field sensor with respect to the axis and having the same axial position as the first magnetic field sensor forms a second magnetic field sensor, which outputs a measurement signal $a_2$. The measurement signals $a_1$ and $a_2$ represent the axial directional components of the magnetic field occurring due to the inverse magnetostrictive effect with an opposite direction; i.e., the measurement signals $a_1$ and $a_2$ represent the axial directional components with different signs. The magnetic field sensor axially adjacent to the first magnetic field sensor and having the same circumferential position as the first magnetic field sensor forms a third of the magnetic field sensors, which outputs a measurement signal $b_1$. The measurement signals $a_1$ and $b_1$ represent the axial directional components of the magnetic field occurring due to the inverse magnetostrictive effect with the same direction; i.e., the measurement signals $a_1$ and $b_1$ represent the axial directional components with the same sign. The magnetic field sensor opposite the third magnetic field sensor in relation to the axis and having the same axial position as the third magnetic field sensor forms a fourth of the magnetic field sensors, which outputs a measurement signal $b_2$. The measurement signals $b_1$ and $b_2$ represent the axial directional components of the magnetic field occurring due to the inverse magnetostrictive effect with an opposite direction; i.e., the measurement signals $b_1$ and $b_2$ represent the axial directional components with different signs. At least two of the measurement values of the torque are determined according to one of the following mathematical rules:

$$M_1 = \frac{a_1 - a_2 - b_1 + b_2}{4}$$

$$M_2 = \frac{a_1 + b_2}{2}$$

$$M_3 = -\frac{a_2 + b_1}{2}$$

The mathematical rules show that there are at least three of the combinations of magnetic field sensors that are sufficient to measure the torque. The first combination includes the first, second, third and fourth magnetic field sensors. The second combination includes the first and fourth magnetic field sensors. The third combination includes the second and third magnetic field sensors.

The test signal T is preferably determined according to one of the following rules:

$T=|M_1-M_2|$ $T=|M_1-M_3|$ $T=|M_2-M_3|$ $T=(M_1-M_2)^2$ $T=(M_1-M_3)^2$ $T=(M_2-M_3)^2$

Preferably, not just two, but all of the three measurement values M1, M2 and M3 are determined. The test signal T is preferably determined according to one of the following rules:

$T=|M_1-M_2|+|M_1-M_3|+|M_2-M_3|$ $T=(M_1-M_2)^2+(M_1-M_3)^2+(M_2-M_3)^2$

In a second particularly preferred embodiment of the method, the arrangement is also suitable for measuring a torque, i.e., a torsional torque, acting on the steering shaft and lying within the axis. The steering shaft exhibits three of the magnetization areas with alternating polarities. The axially central one of the magnetization areas has the same axial position as two of the magnetic field sensors, these two magnetic field sensors having the same axial position being arranged opposite one another with respect to the axis. Two of the four magnetic field sensors each have the same tangential position and are axially adjacent. The magnetization areas arranged axially on the outside each have the same axial position as one of the four magnetic field sensors. A first of the four magnetic field sensors has the same axial position as one of the magnetization areas arranged axially on the outside. The first magnetic field sensor outputs a measurement signal $a_1$. The magnetic field sensor axially adjacent to the first magnetic field sensor and having the same circumferential position as the first magnetic field sensor forms a second of the magnetic field sensors, which outputs a measurement signal $b_1$. The measurement signals $a_1$ and $b_1$ represent the axial directional components of the magnetic field occurring due to the inverse magnetostrictive effect with the same direction; i.e., the measurement signals $a_1$ and $b_1$ represent the axial directional components with the same sign. The magnetic field sensor opposite the second magnetic field sensor in relation to the axis and having the same axial position as the second magnetic field sensor forms a third of the magnetic field sensors, which outputs a measurement signal $b_2$. The measurement signals $b_1$ and $b_2$ represent the axial directional components of the magnetic field occurring due to the inverse magnetostrictive effect with an opposite direction; i.e., the measurement signals $b_1$ and $b_2$ represent the axial directional components with different signs. The magnetic field sensor axially adjacent to the third magnetic field sensor and having the same circumferential position as the third magnetic field sensor forms a fourth of the magnetic field sensors, which outputs a measurement signal $c_2$. The measurement signals $b_2$ and $c_2$ represent the axial directional components of the magnetic field occurring due to the inverse magnetostrictive effect with the same direction; i.e., the measurement signals $b_2$ and $c_2$ represent the axial directional components with the same sign. At least two of the measurement values of the torque are determined according to one of the following rules:

$$M_1 = \frac{a_1 - b_1 + b_2 - c_2}{4}$$

$$M_2 = \frac{a_1 + b_2}{2}$$

$$M_3 = -\frac{b_1 + c_2}{2}$$

The mathematical rules show that there are at least three of the combinations of magnetic field sensors that are sufficient to measure the torque. The first combination includes the first, second, third and fourth magnetic field sensors. The second combination includes the first and fourth magnetic field sensors. The third combination includes the second and third magnetic field sensors.

The test signal T is preferably determined according to one of the following rules:

$T=|M_1-M_2|$ $T=|M_1-M_3|$ $T=|M_2-M_3|$ $T=(M_1-M_2)^2$ $T=(M_1-M_3)^2$ $T=(M_2-M_3)^2$

Preferably, not just two, but all of the three measurement values M1, M2 and M3 are determined. The test signal T is preferably determined according to one of the following rules:

$T=|M_1-M_2|+|M_1-M_3|+|M_2-M_3|$ $T=(M_1-M_2)^2+(M_1-M_3)^2+(M_2-M_3)^2$

In a third particularly preferred embodiment of the method, the arrangement is designed to measure a torque, i.e., a torsional torque, acting on the steering column and located within the axis. The steering column exhibits three of the magnetization areas with alternating polarities. Each of the magnetization areas has the same axial position as two of the magnetic field sensors, these two magnetic field sensors having the same axial position being arranged opposite one another with respect to the axis. Three of the six magnetic field sensors each have the same tangential position and are axially adjacent. A first of the six magnetic field sensors has the same axial position as one of the magnetization areas arranged axially on the outside. The first magnetic field sensor outputs a measurement signal $a_1$. The magnetic field sensor opposite the first magnetic field sensor with respect to the axis and having the same axial position as the first magnetic field sensor forms a second magnetic field sensor, which outputs a measurement signal $a_2$. The measurement signals $a_1$ and $a_2$ represent the axial directional components of the magnetic field occurring due to the inverse magnetostrictive effect with an opposite direction; i.e., the measurement signals $a_1$ and $a_2$ represent the axial directional components with different signs. The magnetic field sensor axially adjacent to the first magnetic field sensor and having the same circumferential position as the first magnetic field sensor forms a third of the magnetic field sensors, which outputs a measurement signal $b_1$. The third magnetic field sensor has the same axial position as the central magnetization area. The measurement signals $a_1$ and $b_1$ represent the axial directional components of the magnetic field occurring due to the inverse magnetostrictive effect with the same direction; i.e., the measurement signals $a_1$ and $b_1$ represent the axial directional components with the same sign. The magnetic field sensor opposite the third magnetic field sensor in relation to the axis and having the same axial position as the third magnetic field sensor forms a fourth of the magnetic field sensors, which outputs a measurement signal $b_2$. The measurement signals $b_1$ and $b_2$ represent the axial directional components of the magnetic field occurring due to the inverse magnetostrictive effect with an opposite direction; i.e., the measurement signals $b_1$ and $b_2$ represent the axial directional components with different signs. The magnetic field sensor axially adjacent to the third magnetic field sensor and having the same circumferential position as the first magnetic field sensor and the third magnetic field sensor forms a fifth of the magnetic field sensors, which outputs a measurement signal $c_1$. The measurement signals $b_1$ and $c_1$ represent the axial directional components of the magnetic field occurring due to the inverse magnetostrictive effect with the same direction; i.e., the measurement signals $b_1$ and $c_1$ represent the axial directional components with the same sign. The magnetic field sensor opposite the fifth magnetic field sensor in relation to the axis and having the same axial position as the fifth magnetic field sensor forms a sixth of the magnetic field sensors, which outputs a measurement signal $c_2$. The measurement signals $c_1$ and $c_2$ represent the axial directional components of the magnetic field occurring due to the inverse magnetostrictive effect with an opposite direction; i.e., the measurement signals $c_1$ and $c_2$ represent the axial directional components with different signs. At least two of the measurement values of the torque are determined according to one of the following rules:

$$M_1 = \frac{a_1 - 2 \cdot b_1 + c_1 - a_2 + 2 \cdot b_2 - c_2}{8}$$

$$M_2 = \frac{a_1 - b_1 + b_2 - c_2}{4}$$

$$M_3 = \frac{-a_2 - b_1 + b_2 + c_1}{4}$$

$$M_4 = \frac{a_1 - a_2 - b_1 + b_2}{4}$$

$$M_5 = \frac{-b_1 + b_2 + c_1 - c_2}{4}$$

$$M_6 = \frac{a_1 + b_2}{2}$$

$$M_7 = -\frac{b_1 + a_2}{2}$$

$$M_8 = -\frac{b_1 + c_2}{2}$$

$$M_9 = \frac{b_2 + c_1}{2}$$

The mathematical rules show that there are at least nine combinations of magnetic field sensors that are each sufficient to measure the torque. The first combination includes the first, the second, the third, the fourth, the fifth and the sixth magnetic field sensor. The second combination includes the first, third, fourth and sixth magnetic field sensors. The third combination includes the second, third, fourth and fifth magnetic field sensors. The fourth combination comprises the first, the second, the third and the fourth magnetic field sensor. The fifth combination includes the third, fourth, fifth and sixth magnetic field sensors. The sixth combination includes the first and fourth magnetic field sensors. The seventh combination comprises the third and the second magnetic field sensor. The eighth combination includes the third and sixth magnetic field sensors. The ninth combination includes the fourth and fifth magnetic field sensors.

Preferably, not just two, but at least four or more preferably all of the nine measurement values M1 to M9 are determined. Preferably, the test signal T is determined accordingly as in the first and second particularly preferred embodiments.

In a fourth particularly preferred embodiment of the method, the arrangement is designed to measure a torque, i.e., a torsional torque, acting on the steering column and located within the axis. The steering column exhibits three of the magnetization areas with alternating polarities. The two magnetization areas arranged axially on the outside each have the same axial position as two of the magnetic field sensors, wherein these two magnetic field sensors have the same axial position and are arranged opposite one another with respect to the axis. The axially central magnetization area has the same axial position as four of the magnetic field sensors, wherein two of these magnetic field sensors are arranged directly adjacent to one another and form a pair. Because of this directly adjacent arrangement, the magnetic field sensors of each of the two pairs have essentially the same position. The two pairs having the same axial position are arranged opposite one another with respect to the axis. Four of the eight magnetic field sensors each have the same tangential position and are axially adjacent. A first of the eight magnetic field sensors has the same axial position as one of the magnetization areas arranged axially on the outside. The first magnetic field sensor outputs a measurement signal $a_1$. The magnetic field sensor opposite the first magnetic field sensor with respect to the axis and having the same axial position as the first magnetic field sensor forms a second magnetic field sensor, which outputs a measurement signal $a_2$. The measurement signals $a_1$ and $a_2$ represent the axial directional components of the magnetic field occurring due to the inverse magnetostrictive effect with an opposite direction; i.e., the measurement signals $a_1$ and $a_2$ represent the axial directional components with different signs. The pair of magnetic field sensors which is axially adjacent to the first magnetic field sensor and has the same circumferential position as the first magnetic field sensor comprises a third of the magnetic field sensors, which outputs a measurement signal $b_{11}$, and a fourth of the magnetic field sensors, which outputs a measurement signal $b_{12}$. The third magnetic field sensor and the fourth magnetic field sensor have the same axial position as the axially central magnetization area. The measurement signals $a_1$, $b_{11}$, and $b_{12}$ represent the axial directional components of the magnetic field occurring due to the inverse magnetostrictive effect with the same direction; i.e., the measurement signals $a_1$, $b_1$ and $b_{12}$ represent the axial directional components with the same sign. The pair opposite the third and fourth magnetic field sensors with respect to the axis and having the same axial position as the third and fourth magnetic field sensors comprises a fifth of the magnetic field sensors, which outputs a measurement signal $b_{21}$ and a sixth of the magnetic field sensors, which outputs a measurement signal $b_{22}$. The measurement signals $b_{11}$ and $b_{21}$ represent the axial directional components of the magnetic field occurring due to the inverse magnetostrictive effect with an opposite direction; i.e., the measurement signals $b_{11}$ and $b_{21}$ represent the axial directional components with different signs. The measurement signals $b_{21}$ and $b_{22}$ represent the axial directional components of the magnetic field occurring due to the inverse magnetostrictive effect with the same direction; i.e., the measurement signals $b_{21}$ and $b_{22}$ represent the axial directional components with the same sign. The magnetic field sensor axially adjacent to the third magnetic field sensor and having the same circumferential position as the first magnetic field sensor, the third magnetic field sensor and the fourth magnetic field sensor forms a seventh of the magnetic field sensors, which outputs a measurement signal $c_1$. The measurement signals $b_{11}$ and $c_1$ represent the axial directional components of the magnetic field occurring due to the inverse magnetostrictive effect with the same direction; i.e., the measurement signals $b_{11}$ and $c_1$ represent the axial directional components with the same sign. The magnetic field sensor opposite the seventh magnetic field sensor in relation to the axis and having the same axial position as the seventh magnetic field sensor forms an eighth of the magnetic field sensors, which outputs a measurement signal $c_2$. The measurement signals $c_1$ and $c_2$ represent the directional components of the magnetic field occurring due to the inverse magnetostrictive effect with an opposite direction; i.e., the measurement signals $c_1$ and $c_2$ represent the axial directional components with different signs. At least two of the measurement values of the torque are determined according to one of the following rules:

$$M_1 = \frac{a_1 - b_{11} - b_{12} + c_1 - a_2 + b_{21} + b_{22} - c_2}{8}$$

$$M_2 = \frac{a_1 - 2 \cdot b_{11} + c_1 - a_2 + 2 \cdot b_{21} - c_2}{8}$$

$$M_3 = \frac{a_1 - b_{11} + b_{21} - c_2}{4}$$

$$M_4 = \frac{-b_{11} + c_1 + b_{21} - c_2}{4}$$

$$M_5 = \frac{a_1 + b_{21}}{2}$$

$$M_6 = -\frac{b_{11} + a_2}{2}$$

$$M_7 = -\frac{b_{11} + c_2}{2}$$

$$M_8 = \frac{b_{21} + c_1}{2}$$

The mathematical rules show that there are at least eight combinations of magnetic field sensors that are sufficient to measure the torque. The first combination includes the first, second, third, fourth, fifth, sixth, seventh and eighth magnetic field sensors. The second combination includes the first, second, third, fifth, seventh and eighth magnetic field sensors. The third combination includes the first, third, fifth and eighth magnetic field sensors. The fourth combination includes the third, fifth, seventh and eighth magnetic field sensors. The fifth combination comprises the first and the fifth magnetic field sensor. The sixth combination comprises the third and the second magnetic field sensor. The seventh combination includes the third and eighth magnetic field sensors. The eighth combination includes the fifth and seventh magnetic field sensors.

Preferably, not just two, but at least four or more preferably all of the eight measurement values M1 to M8 are determined. Preferably, the test signal T is determined accordingly as in the first and second particularly preferred embodiments.

The four described particularly preferred embodiments preferably also have features that are described above as preferred.

The arrangement is used to measure a torque acting on a steering shaft of a motor vehicle. The steering shaft has an axis and at least two magnetization areas extending circumferentially around the axis, each for one magnetization. The arrangement comprises at least four magnetic field sensors each for measuring an axial directional component of a magnetic field caused by the magnetization and the torque.

There are at least two combinations of at least two of the magnetic field sensors each. Each of these combinations is sufficient to measure the torque. The arrangement further comprises a measurement signal processing unit which is designed to carry out the method. The measurement signal processing unit is preferably designed to carry out one of the above-described preferred embodiments of the method. In addition, the arrangement preferably also has features that have been indicated in connection with the method.

The measurement signal processing unit is preferably made up of a microcontroller. In the broader sense, the measurement signal processing unit is preferably made up of a computing unit.

BRIEF DESCRIPTION OF THE DRAWINGS

Further details, advantages and developments arise from the following description of embodiments with reference to the drawing. In the figures:

FIG. 3 a third embodiment of the arrangement is shown in two views; and

DETAILED DESCRIPTION

Figure 1:
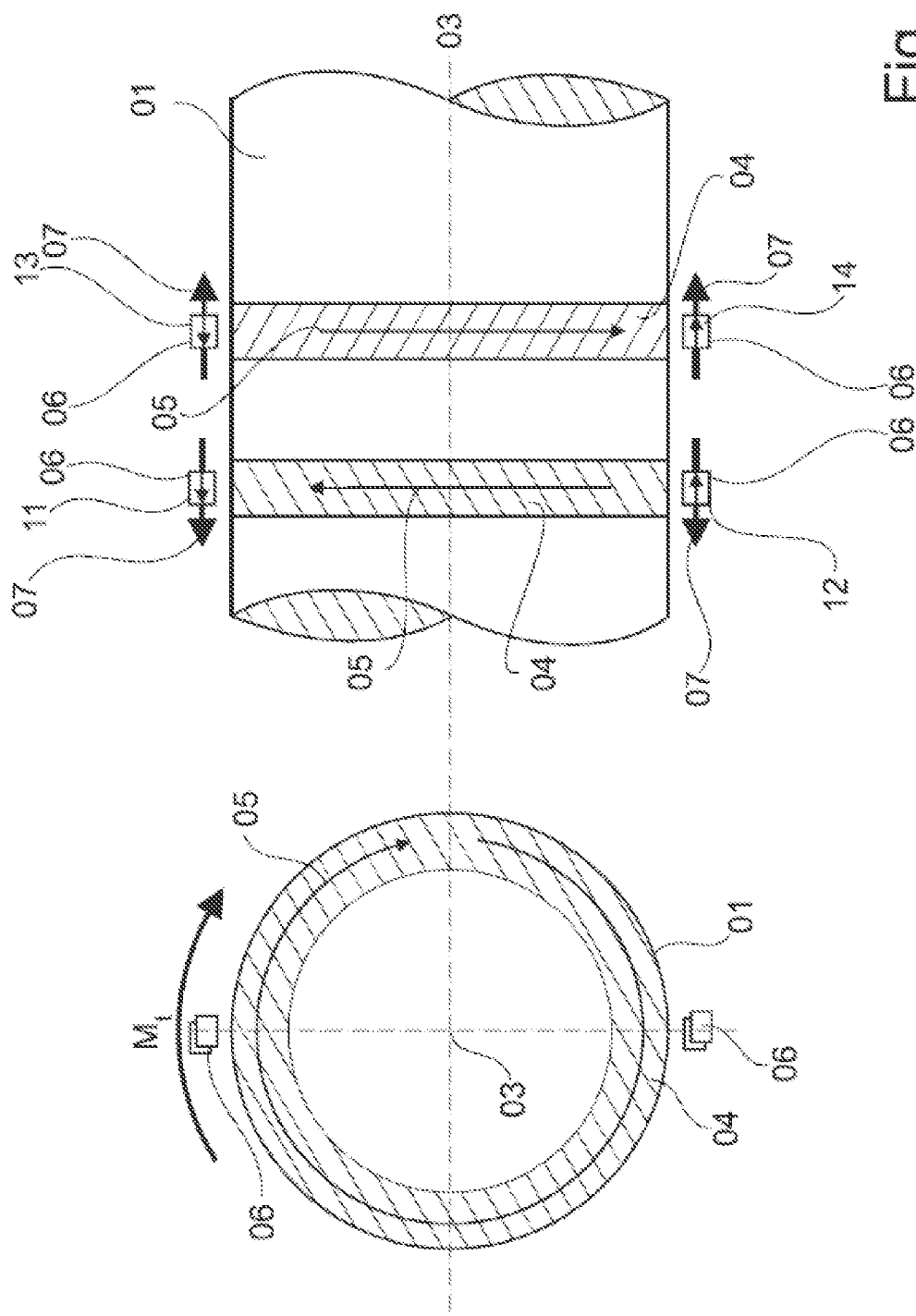
FIG. 1 a first embodiment of an arrangement is shown in two views.

FIG. 1 is a first embodiment of an arrangement in a cross-sectional view and in a longitudinal sectional view. The arrangement comprises a steering shaft 01 of a motor vehicle. The steering shaft 01 is made of steel and extends into an axis 03. A torsional torque $M_t$ acts on the steering shaft 01, which can be measured with the arrangement.

The steering shaft 01 has two magnetization areas 04 in the form of circumferential tracks. The two magnetization areas 04 are permanently magnetized and polarized in opposite directions, which is shown in each case by an arrow 05 illustrating the direction of rotation. The two magnetization areas 04 form a primary sensor for measuring the torsional torque $M_t$ using the inverse magnetostrictive effect.

The arrangement also includes four magnetic field sensors 06, which are located near the steering shaft 01. The four magnetic field sensors 06 are located at the same distance from the axis 03.

The four magnetic field sensors 06 each serve to measure an axial directional component of a magnetic field occurring due to the magnetization of the magnetization areas 04 and the torsional torque Mt due to the inverse magnetostrictive effect. A magnetic field direction of this magnetic field is shown at the positions of the magnetic field sensors 06 by an arrow 07 illustrating the respective magnetic field direction. A positive measuring direction of the magnetic field sensors 06 is illustrated by the symbol used for the magnetic field sensors 06 with an arrow drawn in.

Two of the four magnetic field sensors 06 have the same axial position as a first one of the magnetization areas 04. Two more of the four magnetic field sensors 06 have the same axial position as a second one of the magnetization areas 06.

A first magnetic field sensor 11 of the four magnetic field sensors 06 outputs a signal $a_1$. The magnetic field sensor 06 opposite the first magnetic field sensor 11 in relation to the axis 03 forms a second magnetic field sensor 12 which outputs a signal $a_2$. The magnetic field sensor 06 axially adjacent to the first magnetic field sensor 11 forms a third magnetic field sensor 13 which outputs a signal $b_1$. The magnetic field sensor 06 opposite the third magnetic field sensor 13 in relation to the axis 03 forms a fourth magnetic field sensor 14 which outputs a signal $b_2$.

The arrangement further comprises a microcontroller (not shown) which is used for measurement signal processing and is configured to carry out a method for checking the arrangement.

Figure 2:
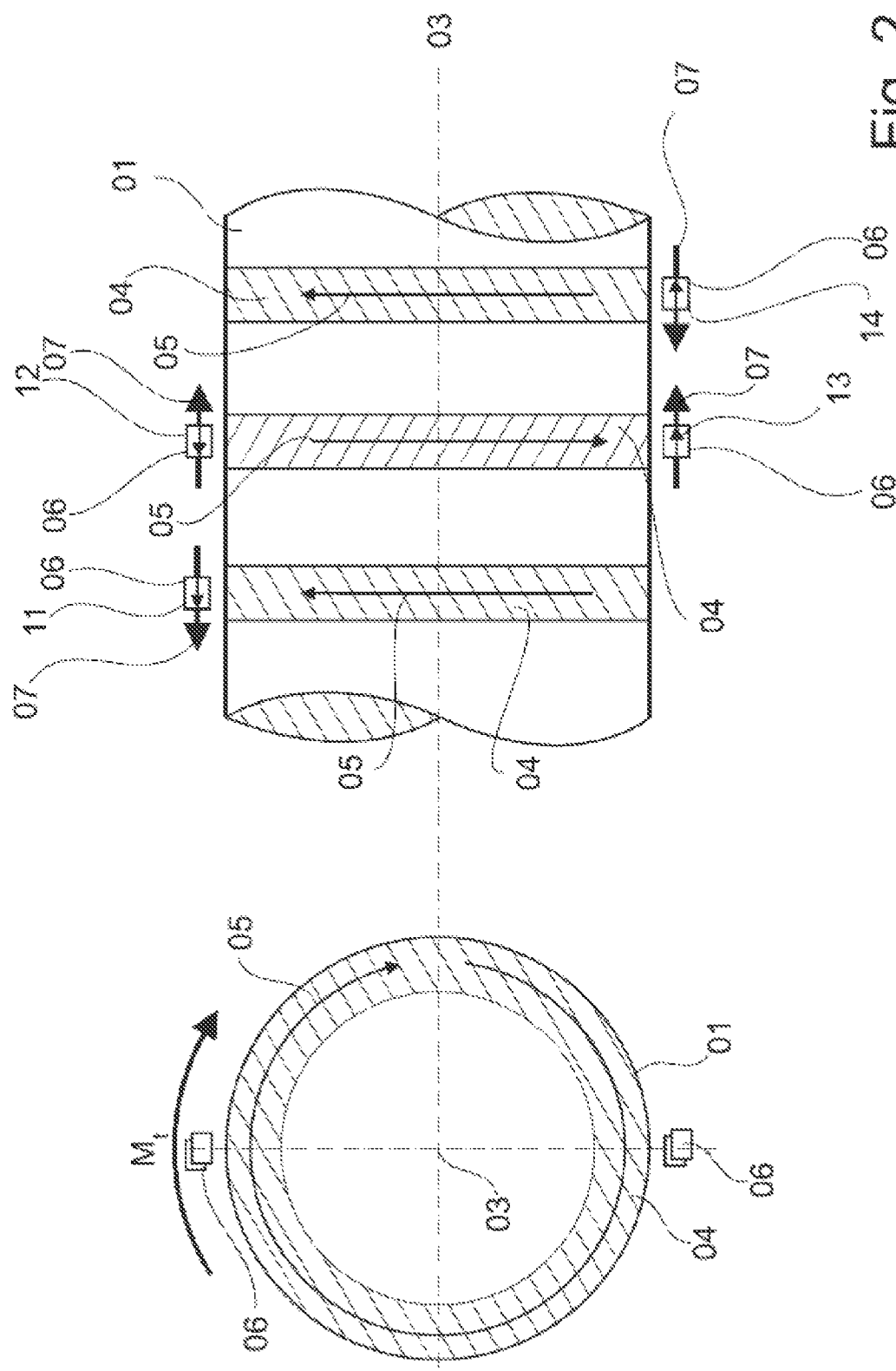
FIG. 2 a second embodiment of the arrangement is shown in two views.

FIG. 2 is a second embodiment of the arrangement in a cross-sectional view and in a longitudinal sectional view. This embodiment is initially similar to the embodiment shown in FIG. 1. In contrast to the first embodiment shown in FIG. 1, the steering shaft 01 has three magnetization areas 04, which are alternately polarized. The first magnetic field sensor 11 of the four magnetic field sensors 06 in turn outputs the signal $a_1$. The second magnetic field sensor 12 is axially adjacent to the first magnetic field sensor 11 and outputs the signal $b_1$. The third magnetic field sensor 13 is arranged opposite the first magnetic field sensor 11 with respect to the axis 03 and outputs the signal $b_2$. The fourth magnetic field sensor 14 is axially adjacent to the third magnetic field sensor 13 and outputs the signal $c_2$.

FIG. 3 is a third embodiment of the arrangement in a cross-sectional view and in a longitudinal sectional view. This embodiment is initially the same as the embodiment shown in FIG. 2. In contrast to the second embodiment shown in FIG. 2, the arrangement comprises six of the magnetic field sensors 06. The first magnetic field sensor 11 of the six magnetic field sensors 06 in turn outputs the signal $a_1$. The second magnetic field sensor 12 is arranged opposite the first magnetic field sensor 11 with respect to the axis 03 and outputs the signal $a_2$. The third magnetic field sensor 13 is axially adjacent to the first magnetic field sensor 11 and outputs the signal $b_1$. The fourth magnetic field sensor 14 is arranged opposite the third magnetic field sensor 13 with respect to the axis 03 and outputs the signal $b_2$. A fifth magnetic field sensor 15 of the six magnetic field sensors 06 is axially adjacent to the third magnetic field sensor 13 and outputs the signal $c_1$. A sixth magnetic field sensor 16 of the six magnetic field sensors 06 is arranged opposite the fifth magnetic field sensor 15 with respect to the axis 03 and outputs the signal $c_2$.

Figure 4:
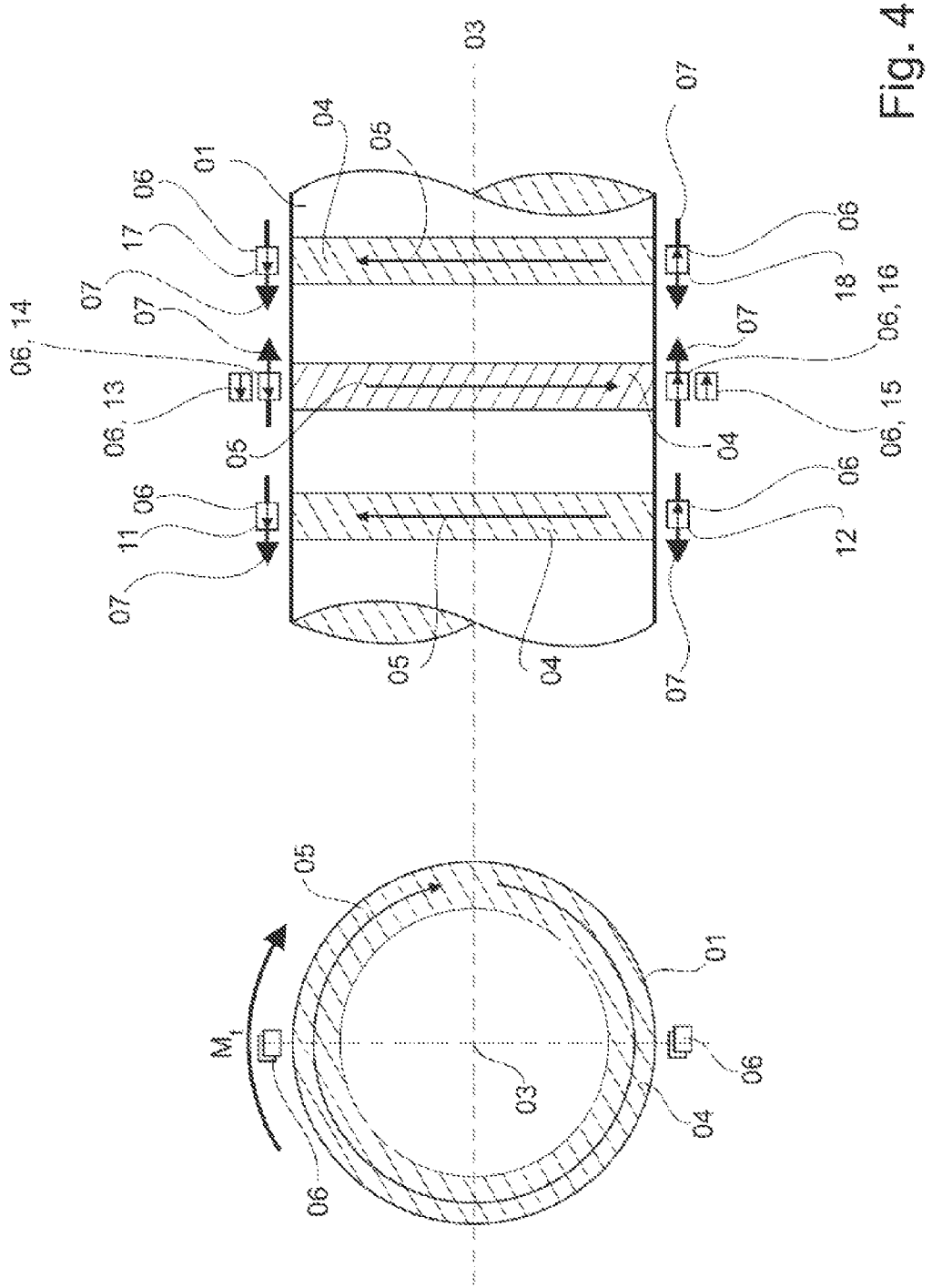
FIG. 4 a fourth embodiment of the arrangement is shown in two views.

FIG. 4 is a fourth embodiment of the arrangement in a cross-sectional view and in a longitudinal sectional view. This embodiment is initially similar to the embodiment shown in FIG. 3. In contrast to the third embodiment shown in FIG. 3, the arrangement comprises eight of the magnetic field sensors 06. The first magnetic field sensor 11 of the six magnetic field sensors 06 in turn outputs the signal $a_1$. The second magnetic field sensor 12 is arranged opposite the first magnetic field sensor 11 with respect to the axis 03 and outputs the signal $a_2$. The third magnetic field sensor 13 is axially adjacent to the first magnetic field sensor 11 and outputs the signal $b_{11}$. The fourth magnetic field sensor 14 is located directly adjacent to the third magnetic field sensor 13 and outputs the signal $b_{12}$. The fifth magnetic field sensor 15 is arranged opposite the third magnetic field sensor 13 with respect to the axis 03 and outputs the signal $b_{21}$. The sixth magnetic field sensor 16 is located directly adjacent to the fifth magnetic field sensor 13 and outputs the signal $b_{22}$. A seventh magnetic field sensor 17 of the eight magnetic field sensors 06 is axially adjacent to the third magnetic field sensor 13 and outputs the signal $c_1$. An eighth magnetic field sensor 18 of the six magnetic field sensors 06 is arranged opposite the seventh magnetic field sensor 17 with respect to the axis 03 and outputs the signal $c_2$.

LIST OF REFERENCE SIGNS

01 Steering shaft
02 -
03 Axis
04 Magnetization area
05 Direction of rotation
06 Magnetic field sensor
07 Magnetic field direction
08 -
09 -
10 -
11 First magnetic field sensor
12 Second magnetic field sensor
13 Third magnetic field sensor
14 Fourth magnetic field sensor
15 Fifth magnetic field sensor
16 Sixth magnetic field sensor
17 Seventh magnetic field sensor
18 Eighth magnetic field sensor

The invention claimed is:

1. A method for measuring a torque acting on a steering shaft of a motor vehicle, the method comprising:
providing:
a steering shaft having an axis and two magnetization areas extending circumferentially around the axis;
four magnetic field sensors configured for measuring an axial component of a magnetic field resulting from the two magnetization areas and by a torque acting on the steering shaft, the four magnetic field sensors arranged such that at least two combinations of at least two of the four magnetic field sensors are configured for measuring the torque acting on the steering shaft; and
a first one and a second one of the four magnetic field sensors are: i) arranged opposite to each other, and ii) axially located opposite to a first one of the two magnetization areas; and
a third one and a fourth one of the four magnetic field sensors are: i) arranged opposite to each other, and ii) axially located opposite to a second one of the two magnetization areas; and
applying the torque to the steering shaft;
determining a first measurement value of the torque with a first one of the at least two combinations of at least two of the four magnetic field sensors;
determining a second measurement value of the torque with a second one of the at least two combinations of at least two of the four magnetic field sensors; and
comparing at least the first measurement value and the second measurement value; and
wherein:
the first one of the four magnetic field sensors outputs a measurement signal $a_1$, the second one of the four magnetic field sensors outputs a measurement signal $a_2$, the third one of the four magnetic field sensors outputs a measurement signal $b_1$, and the fourth one of the four magnetic field sensors outputs a measurement signal $b_2$; and
the first measurement value of the torque and the second measurement value of the torque are determined according to at least two of any of the following mathematical rules:

$$M_1 = \frac{a_1 - a_2 - b_1 + b_2}{4}$$

$$M_2 = \frac{a_1 + b_2}{2}$$

$$M_3 = -\frac{a_2 + b_1}{2}.$$

2. The method according to claim 1, further comprising: determining a third measurement value of the torque with a third combination of the at least two combinations of at least two of the four magnetic field sensors; and comparing the first measurement value, the second measurement value and the third measurement value.

3. The method according to claim 2 wherein comparing the first measurement value, the second measurement value, and the third measurement value comprises a calculation of a sum of absolute amounts of between the first measurement value, the second measurement value, and the third measurement value.

4. The method according to claim 3, wherein an error signal is output if the sum of the absolute amounts exceeds a previously defined maximum.

5. The method according to claim 2 wherein comparing the first measurement value, the second measurement value, and the third measurement value comprises a calculation of a sum of squared differences between the first measurement value, the second measurement value, and the third measurement value.

6. The method according to claim 5, wherein an error signal is output if the sum of squared differences exceeds a previously defined maximum.

7. The method according to claim 1, wherein comparing the first measurement value and the second measurement value comprises a calculation of an absolute amount of a difference between the first measurement value and the second measurement value.

8. The method according to claim 1, wherein the first one of the four magnetic field sensors and the second one of the four magnetic field sensors have a same tangential position relative to the steering shaft.

9. The method according to claim 1, wherein comparing the first measurement value and the second measurement value comprises a calculation of a square of a difference between the first measurement value and the second measurement value.

10. The method according to claim 1, wherein the first one of the four magnetic field sensors and the third one of the four magnetic field sensors are arranged at a same circumferential position relative to the steering shaft.

11. A method for measuring a torque acting on a steering shaft of a motor vehicle, the method comprising:
providing:
a steering shaft having an axis and three magnetization areas extending circumferentially around the axis;
six magnetic field sensors configured for measuring an axial component of a magnetic field resulting from the three magnetization areas and by a torque acting on the steering shaft, the six magnetic field sensors arranged such that at least four combinations of at least two of the six magnetic field sensors are configured for measuring the torque acting on the steering shaft; and
a first one and a second one of the six magnetic field sensors are: i) arranged opposite to each other, and ii) axially located opposite to a first one of the three magnetization areas;

a third one and a fourth one of the six magnetic field sensors are: i) arranged opposite to each other, and ii) axially located opposite to a second one of the three magnetization areas; and a fifth one and a sixth one of the six magnetic field sensors are: i) arranged opposite to each other, and ii) axially located opposite to a third one of the three magnetization areas; and applying the torque to the steering shaft;

determining a first measurement value of the torque with a first one of the at least four combinations of at least two of the six magnetic field sensors;

determining a second measurement value of the torque with a second one of the at least four combinations of at least two of the six magnetic field sensors;

determining a third measurement value of the torque with a third one of the at least four combinations of at least two of the six magnetic field sensors;

determining a fourth measurement value of the torque with a fourth one of the at least four combinations of at least two of the six magnetic field sensors;

comparing the first measurement value, the second measurement value, the third measurement value, and the fourth measurement value; and wherein:
the first one of the six magnetic field sensors outputs a measurement signal $a_1$, the second one of the six magnetic field sensors outputs a measurement signal $a_2$, the third one of the six magnetic field sensors outputs a measurement signal $b_1$, the fourth one of the six magnetic field sensors outputs a measurement signal $b_2$, the fifth one of the six magnetic field sensors outputs a measurement signal $c_1$, and the sixth one of the six magnetic field sensors outputs a measurement signal $c_2$; and the first measurement value, the second measurement value, the third measurement value, and the fourth measurement value of torque are determined according to at least four of any of the following mathematical rules:

$$M_1 = \frac{a_1 - 2 \cdot b_1 + c_1 - a_2 + 2 \cdot b_2 - c_2}{8}$$

$$M_2 = \frac{a_1 - b_1 + b_2 - c_2}{4}$$

$$M_3 = \frac{-a_2 - b_1 + b_2 + c_1}{4}$$

$$M_4 = \frac{a_1 - a_2 - b_1 + b_2}{4}$$

$$M_5 = \frac{-b_1 + b_2 + c_1 - c_2}{4}$$

$$M_6 = \frac{a_1 + b_2}{2}$$

$$M_7 = -\frac{b_1 + a_2}{2}$$

$$M_8 = -\frac{b_1 + c_2}{2}$$

$$M_9 = \frac{b_2 + c_1}{2}.$$

12. The method of claim 11, wherein the third one of the six magnetic field sensors is arranged axially adjacent to both the first one of the six magnetic field sensors and the fifth one of the six magnetic field sensors, and the fourth one of the six magnetic field sensors is arranged axially adjacent to both the second one of the six magnetic field sensors and the sixth one of the six magnetic field sensors.

13. The method of claim 12, wherein the first one of the six magnetic field sensors, the third one of the six magnetic field sensors, and the fifth one of the six magnetic field sensors are arranged at a same circumferential position relative to the steering shaft.

14. A method for measuring a torque acting on a steering shaft of a motor vehicle, the method comprising:

providing:
a steering shaft having an axis and three magnetization areas extending circumferentially around the axis;

eight magnetic field sensors configured for measuring an axial component of a magnetic field resulting from the three magnetization areas and by a torque acting on the steering shaft, the eight magnetic field sensors arranged such that at least four combinations of at least two of the eight magnetic field sensors are configured for measuring the torque acting on the steering shaft; and a first one and a second one of the eight magnetic field sensors are: i) arranged opposite to each other, and ii) axially located opposite to a first one of the three magnetization areas;

a third one and a fifth one of the eight magnetic field sensors are: i) arranged opposite to each other, and ii) axially located opposite a second one of the three magnetization areas;

a fourth one and a sixth one of the eight magnetic field sensors are: i) arranged opposite to each other, and ii) axially located opposite the second one of the three magnetization areas;

a seventh one and an eighth one of the eight magnetic field sensors are: i) arranged opposite to each other, and ii) axially located opposite a third one of the three magnetization areas; and applying the torque to the steering shaft;

determining a first measurement value of the torque with a first one of the at least four combinations of at least two of the eight magnetic field sensors;

determining a second measurement value of the torque with a second one of the at least four combinations of at least two of the eight magnetic field sensors;

determining a third measurement value of the torque with a third one of the at least four combinations of at least two of the eight magnetic field sensors;

determining a fourth measurement value of the torque with a fourth one of the at least four combinations of at least two of the eight magnetic field sensors; and comparing the first measurement value, the second measurement value, the third measurement value, and the fourth measurement value; and wherein:

the first one of the eight magnetic field sensors outputs a measurement signal $a_1$, the second one of the eight magnetic field sensors outputs a measurement signal $a_2$, the third one of the eight magnetic field sensors outputs a measurement signal $b_{11}$, the fourth one of the eight magnetic field sensors outputs a measurement signal $b_{12}$, the fifth one of the eight magnetic field sensors outputs a measurement signal $b_{21}$, the sixth one of the eight magnetic field sensors outputs a measurement signal $b_{22}$, the seventh one of the eight magnetic field sensors outputs a measurement signal $c_1$, and the eighth one of the eight magnetic field sensors outputs a measurement signal $c_2$; and the first measurement value, the second measurement value, the third measurement value, and the fourth measurement value are determined according to at least four of any of the following mathematical rules:

$$M_1 = \frac{a_1 - b_{11} - b_{12} + c_1 - a_2 + b_{21} + b_{22} - c_2}{8}$$

$$M_2 = \frac{a_1 - 2 \cdot b_{11} + c_1 - a_2 + 2 \cdot b_{21} - c_2}{8}$$

$$M_3 = \frac{a_1 - b_{11} + b_{21} - c_2}{4}$$

$$M_4 = \frac{-b_{11} + c_1 + b_{21} - c_2}{4}$$

$$M_5 = \frac{a_1 + b_{21}}{2}$$

$$M_6 = -\frac{b_{11} + a_2}{2}$$

$$M_7 = -\frac{b_{11} + c_2}{2}$$

$$M_8 = \frac{b_{21} + c_1}{2}.$$

15. The method according to claim 14, wherein the third one of the eight magnetic field sensors is arranged directly adjacent to the fourth one of the eight magnetic field sensors, and the fifth one of the eight magnetic field sensors is arranged directly adjacent to the sixth one of the eight magnetic field sensors.

16. The method according to claim 14, wherein first one of the eight magnetic field sensors, the fourth one of the eight magnetic field sensors, and the seventh one of the eight magnetic field sensors are arranged at a same circumferential position relative to the steering shaft.

17. The method according to claim 16, wherein the three magnetization areas have alternating polarities.

18. A method for measuring a torque acting on a steering shaft of a motor vehicle, the method comprising:

providing:

a steering shaft having an axis and three magnetization areas extending circumferentially around the axis;

four magnetic field sensors configured for measuring an axial component of a magnetic field resulting from the three magnetization areas and by a torque acting on the steering shaft, the four magnetic field sensors arranged such that at least two combinations of at least two of the four magnetic field sensors are configured for measuring the torque acting on the steering shaft; and a first one of the four magnetic field sensors is axially located opposite to a first one of the three magnetization areas;

a second one and a third one of the four magnetic field sensors are: i) arranged opposite to each other, and ii) axially located opposite to a second one of the three magnetization areas; and a fourth one of the four magnetic field sensors is axially located opposite to a third one of the three magnetization areas;

applying the torque to the steering shaft;

determining a first measurement value of the torque with a first one of the at least two combinations of at least two of the four magnetic field sensors;

determining a second measurement value of the torque with a second one of the at least two combinations of at least two of the four magnetic field sensors; and comparing the first measurement value with the second measurement value; and wherein:

the first one of the four magnetic field sensors outputs a measurement signal $a_1$, the second one of the four magnetic field sensors outputs a measurement signal $b_1$, the third one of the four magnetic field sensors outputs a measurement signal $b_2$, and the fourth one of the four magnetic field sensors outputs a measurement signal $c_2$; and the first measurement value of torque and the second measurement value of torque are determined according to at least two of any of the following mathematical rules:

$$M_1 = \frac{a_1 - b_1 + b_2 - c_2}{4}$$

$$M_2 = \frac{a_1 + b_2}{2}$$

$$M_3 = -\frac{b_1 + c_2}{2}.$$

19. The method according to claim 18, wherein the first one of the four magnetic field sensors is arranged adjacent to the second one of the four magnetic field sensors, and the third one of the four magnetic field sensors is arranged adjacent to the fourth one of the four magnetic field sensors.

20. The method according to claim 18, wherein:
the first one of the four magnetic field sensors and the second one of the four magnetic field sensors are arranged at a same circumferential position relative to the steering shaft; and
the third one of the four magnetic field sensors and the fourth one of the four magnetic field sensors are arranged at a same circumferential position relative to the steering shaft.

* * * * *